United States Patent [19]
Miki et al.

[11] Patent Number: 5,395,770
[45] Date of Patent: Mar. 7, 1995

[54] METHOD OF CONTROLLING MISFIT DISLOCATION

[75] Inventors: Katsuhiko Miki, Nishigou; Yukio Naruke, Choushi, both of Japan

[73] Assignee: Shin-Etsu Handotai Co., Ltd., Tokyo, Japan

[21] Appl. No.: 103,171

[22] Filed: Aug. 6, 1993

Related U.S. Application Data

[63] Continuation of Ser. No. 834,974, Feb. 12, 1992, abandoned, which is a continuation of Ser. No. 588,430, Sep. 26, 1990, abandoned.

[30] Foreign Application Priority Data

Sep. 29, 1989 [JP] Japan ................................. 1-253822

[51] Int. Cl.$^6$ .................... H01L 21/20; H01L 21/322
[52] U.S. Cl. ............................. 437/10; 148/DIG. 97; 148/DIG. 127; 437/12; 437/19; 437/81; 437/939; 437/946; 437/976; 437/977
[58] Field of Search ................. 437/10, 12, 19, 81, 437/939, 946, 976, 977; 148/DIG. 97, DIG. 127

[56] References Cited

U.S. PATENT DOCUMENTS

| | | | |
|---|---|---|---|
| 3,923,567 | 12/1975 | Lawrence | 437/10 |
| 4,131,487 | 12/1978 | Pearce et al. | 437/19 |
| 4,257,827 | 3/1981 | Schwattke et al. | 437/11 |
| 4,276,114 | 6/1981 | Takano et al. | 156/645 |
| 4,376,657 | 3/1983 | Nagasawa et al. | 437/11 |
| 4,525,239 | 6/1985 | Wang | 156/645 |
| 4,659,400 | 4/1987 | Garbis et al. | 437/10 |
| 4,782,029 | 11/1988 | Takemura et al. | 437/19 |
| 4,878,988 | 11/1989 | Hall et al. | 437/13 |
| 5,130,260 | 7/1992 | Suga et al. | 437/10 |

FOREIGN PATENT DOCUMENTS

| | | | |
|---|---|---|---|
| 0124236 | 9/1980 | Japan | 437/11 |
| 0153438 | 9/1982 | Japan | |

OTHER PUBLICATIONS

Wolf et al., *Silicon Processing for the VLSI Era*, vol. 1: *Process Technology*, Lattice Press, 1986, pp. 136–139.

Hull et al, "Variation in Misfit Dislocation Behavior as a Function of Strain in Strain in the GeSi/Si System", Applied Physics Letters, vol. 54, No. 10, Apr. 6, 1989, pp. 925–927.

"Semiconductor Wafer Process Contamination Gettering", IBM Technical Disclosure Bulletin, vol. 29, No. 4, Sep., 1986, p. 1561.

H. Kikuchi et al, "New Gettering Using Misfit Dislocations in Homoepitaxial Wafers With Heavily Boron—Doped Silicon Substrates", Applied Physics Letters, vol. 54, No. 5, Jan., 1989, pp. 463–465.

A. Salih et al, "Grated Diode Leakage and Lifetime Measurements of Misfit Dislocation Gettered Si Epitaxy", Applied Physics Letters, vol. 50, No. 23, Jun. 8, 1987, pp. 1678–1680.

D. Beauchaine et al, "Effect of Thin Film Stress and Oxygen Precipitation on Warpage Behavior of Large Diameter P/P+ Epitaxial Wafers", Journal of the Electrochemical Society, vol. 136, No. 6, Jun., 1989, pp. 1787–1793.

*Primary Examiner*—Mary Wilczewski
*Attorney, Agent, or Firm*—Oliff & Berridge

[57] ABSTRACT

A method of controlling a misfit dislocation in a process of producing an epitaxial semiconductor wafer comprising a semiconductor substrate and an epitaxial layer deposited on the semiconductor substrate, an impurity concentration of the epitaxial layer differing from that of the semiconductor substrate, has the step of controlling the amount of an extrinsic strain caused on the back surface of the semiconductor substrate prior to the step of depositing the epitaxial layer, thereby controlling an occurrence of misfit dislocation caused in and near the interface between the semiconductor substrate and the epitaxial layer.

9 Claims, 6 Drawing Sheets

MISFIT DISLOCATION

EXTRINSIC STRAIN PRESENT

FIG. 3(B)

EXTRINSIC STRAIN NONE

METHOD OF CONTROLLING MISFIT DISLOCATION

This is a continuation of Ser. No. 07/834,974, filed Feb. 12, 1992, now abandoned, which in turn is a continuation of Ser. No. 07/588,430, filed Sep. 26, 1990, now abandoned.

BACKGROUND OF THE INVENTION

1. Field of the Invention

The present invention relates to a process for producing an epitaxial wafer and more particularly to a method of controlling a misfit dislocation to be created in or near the interface between a semiconductor substrate of the epitaxial wafer and an epitaxial layer thereof during producing the epitaxial wafer.

2. Description of the Related Art

Recently, the so-called epitaxial wafer comprising a semiconductor substrate of a lower resistivity and an epitaxial layer of a higher resistivity has drawn an attention as a starting wafer for a high integrated DRAM or a high-speed CMOS device.

On the other hand, a metal impurity intrinsically contained in crystal or invading a wafer during producing the above semiconductor device is present at a junction in the wafer. The metal impurity causes various crystal defects and causes a current leakage or dielectric strength deterioration, so that the performance of the semiconductor device deteriorates. In order to avoid the deteriorations in the performnce of the semiconductor device various attempts have been taken for the wafer.

In particular, exemplifying an epitaxial wafer, it has been thought that since the epitaxial wafer has a structure in which an epitaxial growth layer is epitaxially interfaced with a semiconductor substrate, the top surface layer of the epitaxial layer in and on which a semiconductor device is fabricated is remote from the back surface of the semiconductor substrate. Therefore, creating an extrinsic deformation or strain on the back surface of the semiconductor substrate cannot produce a desired gettering effect. For example, A. S. Salih et al have stated this fact in PP. 419–421, Appl., Phys., Lett., Vol. 46, No. 4, Feb. 15, 1985.

On the other hand, H. Kikuchi et al have reported in PP. 463–465, Appl., Phys., Lett., Vol. 54, No.5,, Jan. 30, 1989 that they discovered in and near the interface between a high-doped and reduced crystal lattice spacing of the substrate of an p/p$^+$-structured epitaxial wafer and a normal crystal lattice spacing of the epitaxial growth layer of the p/p$^+$-structured epitaxial wafer and in particular, near the top surface of the substrate adjoining the epitaxial growth layer, a misfit dislocation caused by a misfit between the crystal lattice of the substrate and the normal crystal lattice of the epitaxial growth layer and that the misfit dislocation getters a metal impurity.

Figure 5:
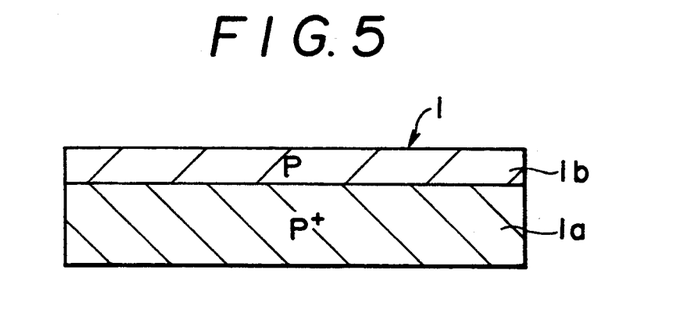
FIG. 5 is a longitudinal section through an epitaxial wafer.

FIG.5 illustrates a schematic longitudinal section of a p/p$^+$-structured epitaxial wafer. In FIG.5, the epitaxial wafer generally indicated at 1 comprises a p$^+$-type semiconductor substrate 1a and a p-type epitaxial layer 1b deposited on one major surface of the semiconductor substrate 1a.

An impurity concentration of the semiconductor substrate 1a is $1 \times 10^{18}$ atoms/cc or more and the other hand, an impurity (i.e., boron) concentration of the epitaxial layer 1b is about $1 \times 10^{15}$ atoms/cc. The concentration difference is in or over three digits in the exponent of 10.

The p/p$^+$-structured epitaxial wafer 1 with such great impurity concentration difference is ready to create a misfit dislocation in the interface between the semiconductor substrate 1a and epitaxial layer 1b, which will depend on other specifications of the epitaxial wafer 1. This misfit dislocation getters a heavy metal present in the epitaxial wafer 1.

Figure 6:
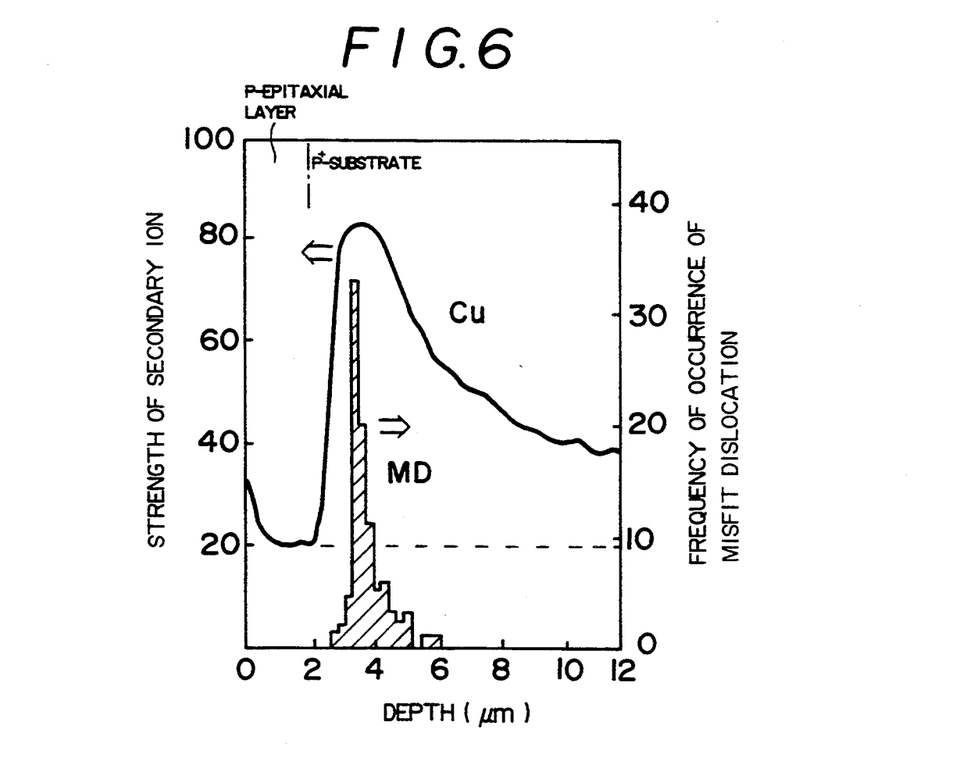
FIG. 6 is a combined graph representing a TEM-image of misfit dislocations and a frequency distribution of the misfit dislocations, and a result of a secondary ion-mass spectrography of a Cu density in-depth profile when the top surface of the epitaxial wafer of FIG. 5 is positively contaminated with Cu.

FIG.6 represents results of measurements of distributions of the concentration of intentionally doped Cu in the depth of the p/p$^+$-structured epitaxial layer and semiconductor substrate and the density of created misfit dislocation.

As apparent from FIG.6, the misfit dislocations are created in the interface between the semiconductor substrate 1a and epitaxial layer 1b, the distribution of the density of the misfit dislocation well matches that of the concentration of the Cu so that part of the interface having the peak distribution of the density of the misfit dislocation effectively getters the Cu.

The present inventors tested in detail how an epitaxial growth condition affects a creation of misfit dislocations and found out that the creation of misfit dislocations remarkably depended on a difference between impurity concentrations of an epitaxial growth layer and a substrate, the thicknesses of the epitaxial growth layer and substrate, etc.

The present inventors also found out that intrinsic misfit dislocations present in the epitaxial wafer were ununiform over the epitaxial wafer and the amount of the intrinsic misfit dislocations was small.

Figure 7:
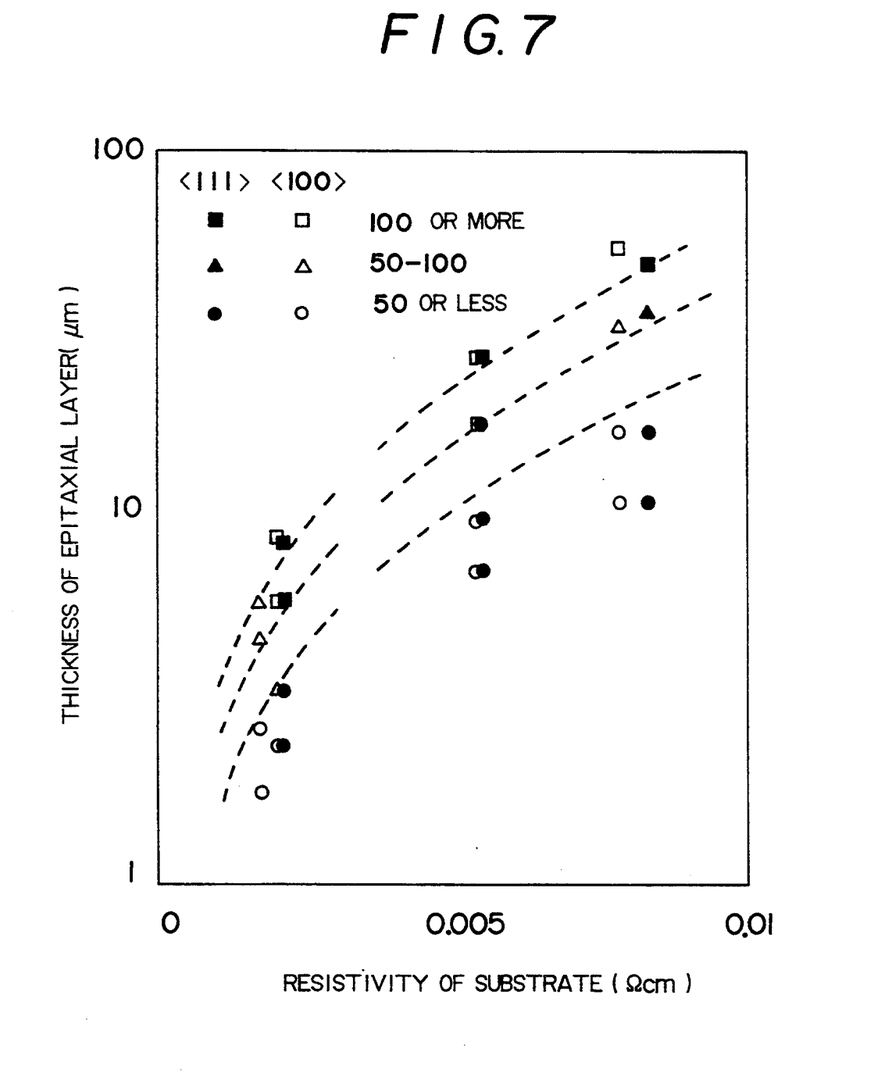
FIG. 7 is a graph representing a creation of misfit dislocation when the resistivity of a semiconductor substrate and the thickness of an epitaxial layer are changed.
Figure 8:
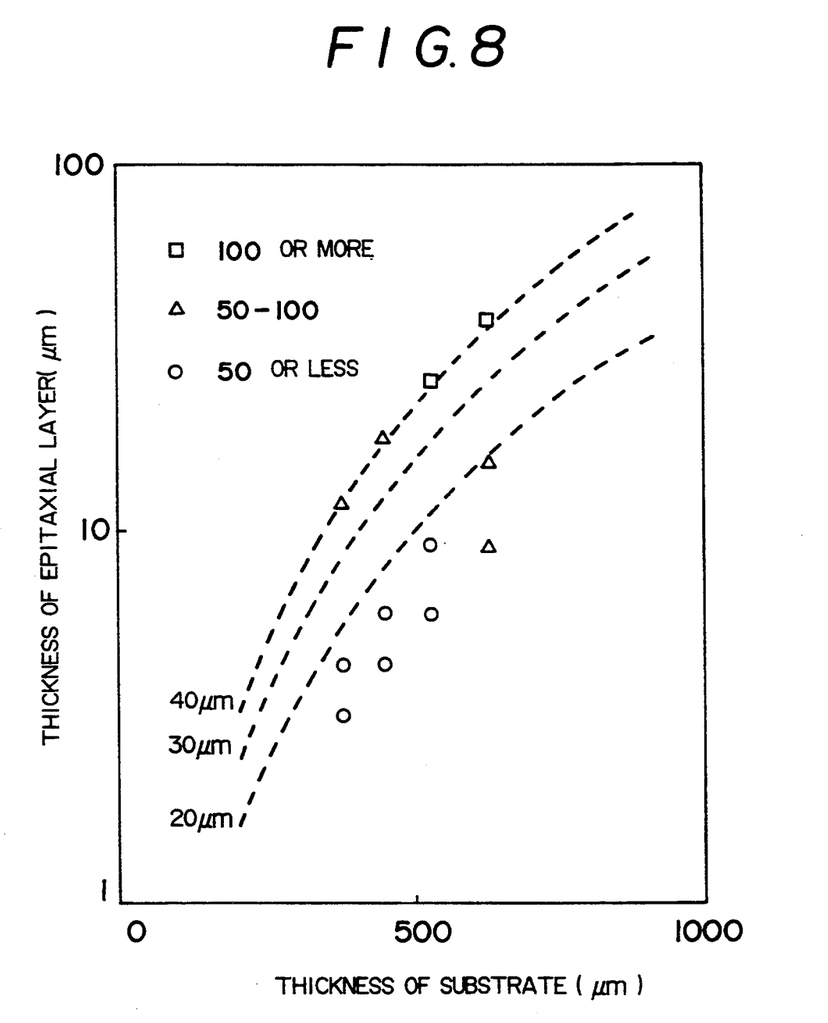
FIG. 8 is a graph representing a creation of misfit dislocation when the thickness of a semiconductor substrate and the resistivity of an epitaxial layer are changed.

FIGS. 7 and 8 represent how the resistivity of a silicon crystal substrate and the thickness of an epitaxial layer characterizes the frequency of creation of misfit dislocations when a p-type and 10 Ωcm epitaxial layer is grown on each of 530 μm p$^+$-type silicon crystal substrates with <111> and <100> crystal orientations. In FIGS. 7 and 8, the symbol of a white square represents the frequency of creation of 100 or more misfit dislocations in the case of the substrate of <100> crystal orientation, the symbol of a black square represents the frequency of creation of 100 or more misfit dislocations in the case of the substrate of <111> crystal orientation, the symbol of a white regular triangle represents the frequency of creation of above 50 and below 100 misfit dislocations in the case of the substrate of <100> crystal orientation, the symbol of a black regular triangle represents the frequency of creation of above 50 and below 100 misfit dislocations in the case of the substrate of <111> crystal orientation, the symbol of a white circle represents the frequency of creation of 50 or less misfit dislocations in the case of the substrate of <100> crystal orientation, and the symbol of a black circle represents the frequency of creation of 50 or less misfit dislocations in the case of the substrate of <111> crystal orientation. The values superimposed on the respective curves in broken lines represent bows of epitaxial wafers.

As apparent from FIGS. 7 and 8, the larger an epitaxial wafer bow, the greater the number of misfit dislocations. Herein, Lang's method of x-ray diffraction topography performs a (400) diffraction of the epitaxial wafer and took a topography throughout each of the epitaxial wafers so that the topographical images of misfit dislocations present in the epitaxial wafer were counted to provide the density of misfit dislocation of the epitaxial wafer.

As apparent from the above description, specifications of an epitaxial wafer decides the frequency of creation of intrinsic misfit dislocations in the epitaxial wafer. However, the gettering effect of only the intrinsic misfit dislocations present in the epitaxial wafer are insufficient as a due intrinsic gettering effect of the epitaxial wafer in producing an actual high integrated semiconductor circuit device. In addition, it is impractical that the specifications of the epitaxial wafer is selected to achieve the effective frequency of occurrence of intrinsic misfit dislocations, i.e., the intrinsic gettering operation of the epitaxial wafer.

Another gettering method for epitaxial wafer is the so-called IG method using a microdefect created by a precipitation of an oxygen concentration exceeding the solubility of oxygen in the epitaxial wafer. However, the IG method is impractical because of the ununiformity and the poor repeatability of a gettering effect throughout an epitaxial wafer.

In addition, a formation of a Ge mixed crystal layer during an epitaxial layer growth period, taught in the above report of A. S. Salih et al, uses the above-described misfit dislocation. This teaching entails a technological problem in determining the mixing ratio of the Ge mixed crystal and controlling the creation of a misfit dislocation thereby.

Therefore, an object of the present invention is to provide a method of effectively increasing and controlling the frequency of creation of misfit dislocation in and near the interface between the semiconductor substrate and an epitaxial layer with an impurity concentration different from that of the semiconductor substrate, in a process for producing an epitaxial wafer in which the epitaxial layer is deposited on the semiconductor substrate. The process of the present invention provides an actual means for gettering the epitaxial layer.

SUMMARY OF THE INVENTION

The present inventors variously studied a misfit dislocation created at the interface between the substrate and epitaxial growth layer of the epitaxial wafer so that the impurity concentrations of the substrate and epitaxial layer were different and then discovered that creating a predetermined extrinsic mechanical strain on the back surface of the substrate prior to the epitaxial growth increased and controlled the number of intrinsic misfit dislocations present in the epitaxial wafer.

The present invention was made on the basis of this discovery. In a process for depositing an epitaxial layer with an impurity concentration different from that of a semiconductor substrate, a method of controlling a misfit dislocation of the present invention comprises the steps of: creating a mechanical strain on the back surface of the semiconductor substrate by means of applying an extrinsic mechanical strain creating method, e.g., sandblast to the back surface of the semiconductor substrate prior to depositing the epitaxial layer; and then depositing an epitaxial layer on the semiconductor substrate so as to increase the frequency of creation of misfit dislocation in and near the interface between the semiconductor substrate and the epitaxial layer and control the density of creation of misfit dislocation. In this aspect of the present invention, methods of creating a mechanical strain on the back surface of the semiconductor substrate also comprise a hard needle scribing and a free-abrasive pressing, which can preferably control the amount of the mechanical strain. Both wet and dry sandblasts are effective. Hard particles used in sandblast preferably are high-purity silica ($SiO_2$) powder for preventing contamination.

For example, in a $p/p^+$-structured epitaxial wafer with boron added as an impurity, a crystal lattice spacing in the semiconductor substrate is decreased so that a crystal lattice in a region of the epitaxial layer near the interface is compressed to naturally create a lattice strain near the interface thereby to create an intrinsic misfit dislocation. On the other hand, producing the predetermined extrinsic mechanical strain on the back surface of the semiconductor substrate prior to epitaxial growth further increases the frequency of creation of intrinsic misfit dislocation in the epitaxial wafer. Such increased misfit dislocations effectively getters mainly a metal impurity present in the epitaxial layer so as to improve the performances of various devices deposited in and/or near the top surface of the epitaxial layer. Thus, the method of the present invention of controlling a misfit dislocation remarkably increases the yield of nondefective of a high-integrated semiconductor device, for example.

The extrinsic mechanical strain created by sandblast etc. on the back surface of the $p^+$-type semiconductor substrate produces a counteraction to a shrunk crystal lattice present in the $p^+$-type semiconductor substrate on the epitaxial layer. Despite the above-mentioned counteraction such extrinsic strain contributes to an increase of a misfit dislocation in and near the interface. It is apparent from an embodiment of the present invention described hereinafter that providing a mechanical extrinsic strain to the back surface of the wafer creates a high-density of misfit dislocation in or near the interface between the epitaxial layer and substrate.

In addition, the present invention controls the amount of created extrinsic strains thereby to control the frequency or level of creation of misfit dislocation. In addition, the present invention uniformly creates an extrinsic strain on the back surface of a semiconductor substrate for epitaxial wafer thereby to uniformly create a misfit dislocations.

DESCRIPTION OF THE PREFERRED EMBODIMENTS

The preferred embodiments of a process of the present invention for producing an epitaxial wafer will be described with reference to FIGS. 1-4 hereinafter.

Figure 1A:
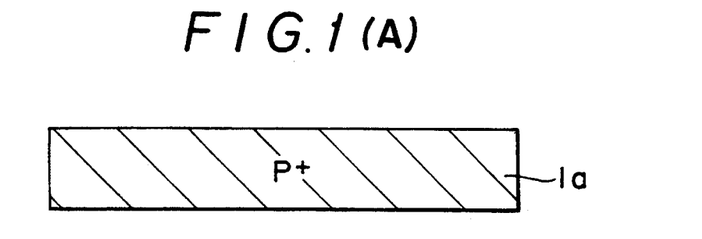
FIGS. 1(A) and 1(B) are illustrations of a process for producing an epitaxial wafer of an embodiment of the present invention, FIG. 1(A) being a longitudinal section through a semiconductor substrate prior to a deposition of an epitaxial layer, FIG. 1(B) being a longitudinal section through the epitaxial wafer.
Figure 1B:
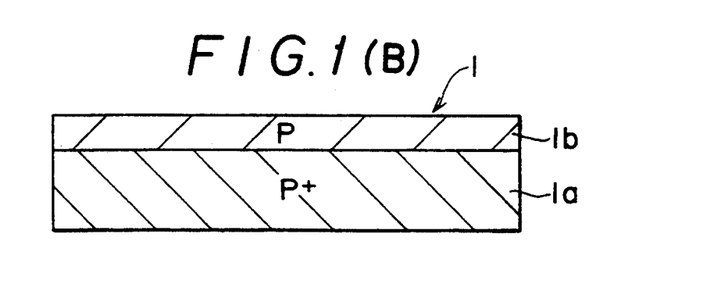

FIG. 1(B) illustrates a longitudinal section through an epitaxial wafer.

In FIG. 1(B), an epitaxial wafer indicated at i includes an p-type epitaxial layer 1b deposited on one major surface of a p+-type semiconductor substrate 1a of FIG. 1(A).

Figure 2:
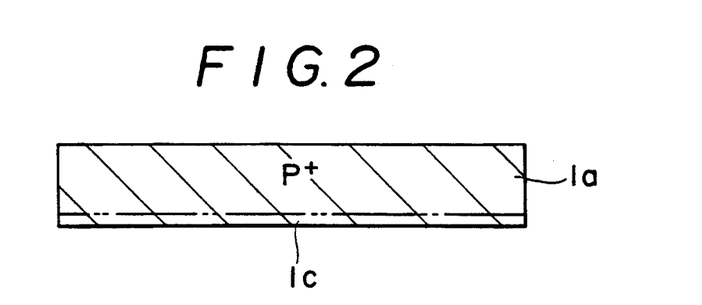
FIG. 2 is a longitudinal section through the semiconductor substrate to which an extrinsic strain has been provided.

In the present embodiment, the impurity concentration of the semiconductor substrate 1a is $1 \times 10^{18}$ atoms/cc or more and the impurity concentration of the epitaxial layer 1b is $1 \times 10^{15}$ atoms/cc or less. A dopant for the semiconductor substrate 1a and epitaxial layer 1b was boron (i.e., B). Blasting $SiO_2$ particles to the back surface of the semiconductor substrate 1a by sandblast prior to a deposition of the p-type epitaxial layer 1b created an extrinsically strained layer 1c as shown in FIG. 2 in order to cause a creation of misfit dislocations in the epitaxial wafer.

The following test was conducted in order to establish the effect of the creation of the misfit dislocations in the epitaxial wafer produced by the above process:

I. Test Conditions

1) Semiconductor substrate for epitaxial wafer

The test employed a generally circular p-type semiconductor substrate produced by Czochralski process. The diameter of the semiconductor substrate was 100 mm. The crystal orientation thereof was <100>. The resistivity thereof was 0.002 Ωcm (Boron concentration: $5.7 \times 10^{18}$ atoms/cc). The thickness thereof was 525 μm.

2) Epitaxial layer

The epitaxial layer was p-type. The thickness thereof was 3.3 μm. The resistivity thereof was 12 Ωcm (Boron concentration: $1.1 \times 10^{15}$ atoms/cc).

The epitaxial layer was grown in a cylindrical furnace under the following conditions:

i) Hydrogen flow: 140 l/min
 ii) Pressure: 760 Torr
 iii) Si-source: $SiHCl_3$
 iv) Doping gas: $B_2H_6$
 v) Growth rate: 1.0 μm/min 3) Extrinsic strain Sandblast created an extrinsic strain on the back surface of the semiconductor substrate. The LD density of the extrinsic strain is $45 \times 10^4$.

i) $SiO_2$ particle size: 4-5 μm diameter
 ii) Damage depth: 1 μm
 iii) Blast pressure: 1.0 kg/cm²

4) Evaluation of misfit dislocation

Figure 3A:
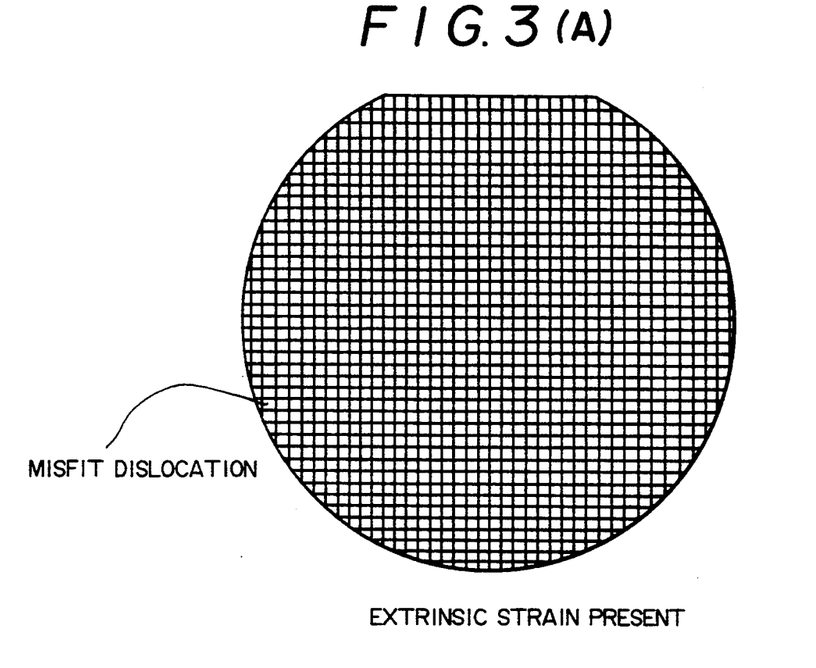
FIG. 3(A) is a schematic diagram of an epitaxial wafer with extrinsic strain.

FIGS. 3(A) and (B) are schematic diagrammatic views of the back surfaces of epitaxial wafers of a (400) diffraction taken by Lang's method of X-ray topography. In particular, FIG. 3(A) represents a creation of misfit dislocations (misfit lines) in an epitaxial wafer with extrinsic strain and on the other hand, FIG. 3(B) represents a creation of misfit dislocations in an epitaxial wafer without extrinsic strain.

Figure 3B:
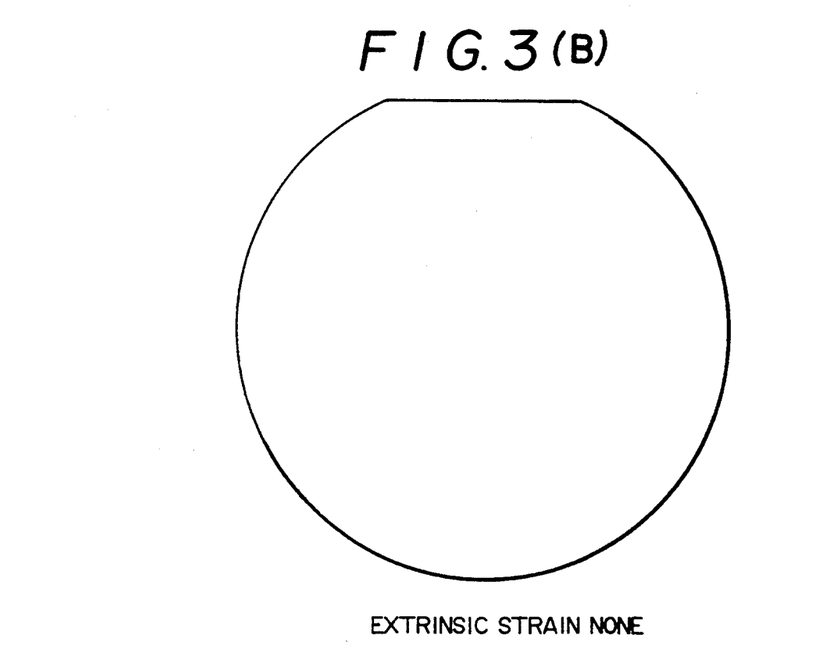
FIG. 3(B) is a schematic diagram of an epitaxial wafer without extrinsic strain.

As apparent from FIGS. 3 (A) and 3(B), only the epitaxial wafer with extrinsic strain of FIG. 3(A) has a grid-shaped arrangement of misfit dislocations.

Figure 4:
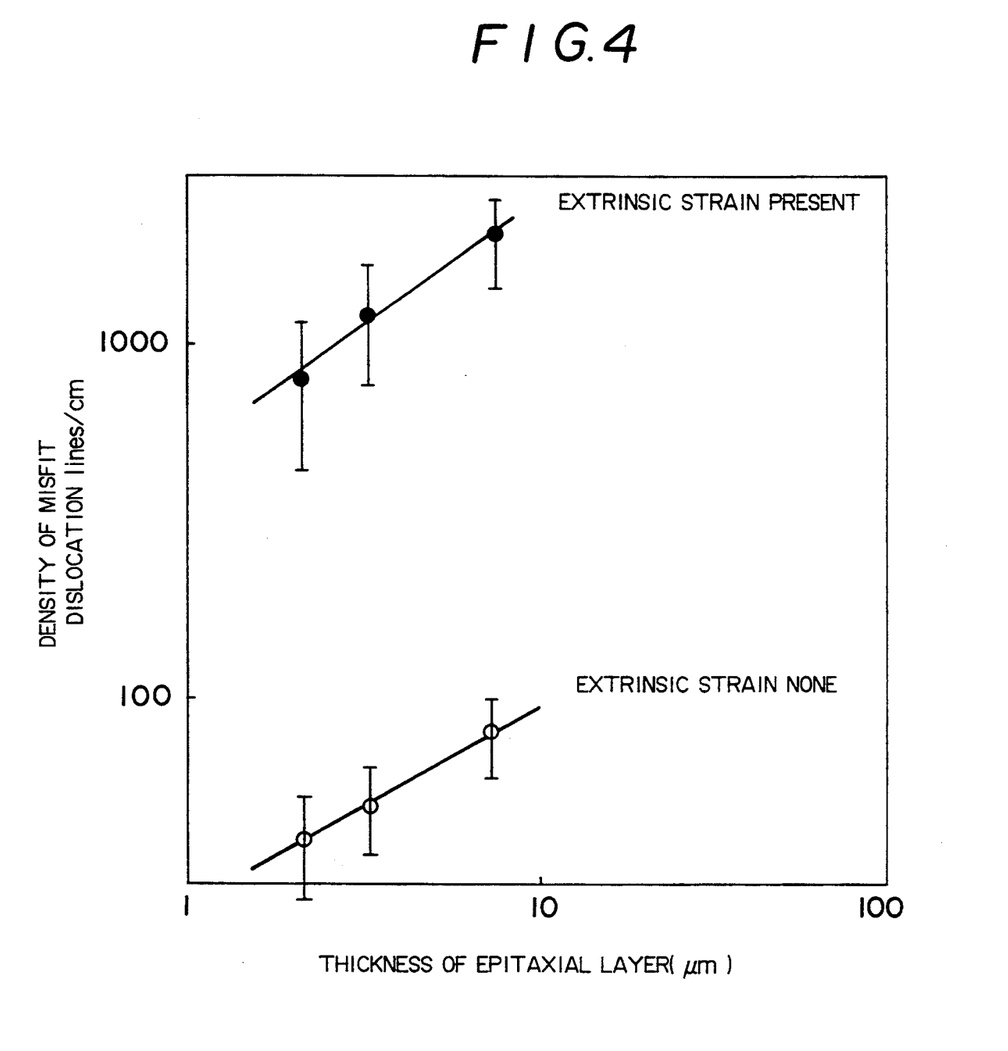
FIG. 4 is a graph representing a comparison between creations of misfit dislocation in the epitaxial wafer with extrinsic strain of FIG. 3(A) and in the epitaxial wafer without extrinsic strain of FIG. 3(B)

FIG. 4 represents the densities of misfit dislocation of an epitaxial wafer with extrinsic strain (LD density: $45 \times 10^4$) and an epitaxial wafer without extrinsic strain, both the wafers having the same production conditions other than the presence or absence of extrinsic strain.

Counting the number of misfit dislocations present in the whole epitaxial wafer without extrinsic strain directly from an X-ray topograph of this epitaxial wafer provides the density of misfit dislocation of the epitaxial wafer without extrinsic strain. On the other hand, the density of misfit dislocation of the epitaxial wafer with extrinsic strain was computed from the total number of misfit dislocations per about 1 cm² area of an X-ray topograph of this epitaxial wafer as a representative value, which expresses the number of dislocation lines crossing an imaginary line 1 cm long on the surface.

This measurement of the density of misfit dislocation resulted in that a first epitaxial wafer comprising a semiconductor substrate 1a without extrinsic strain and an epitaxial layer 1b deposited on the semiconductor substrate 1a failed to produce many misfit dislocations and on the other hand, a second epitaxial wafer 1 comprising a semiconductor substrate 1a with extrinsic strain and an epitaxial layer 1b deposited on the semiconductor substrate 1a produced a multitude of misfit dislocations many times those in the case of the first epitaxial wafer 1.

The above embodiment of the present invention blasted $SiO_2$ particles to the back surface of the semiconductor substrate of the epitaxial wafer to create the extrinsic strain on the back surface of the semiconductor substrate. Alternatively, forming a silicon nitride film or polysilicon film on the back surface of a semiconductor substrate may provide an extrinsic strain to the back surface. In addition, an ion plantation of Ar etc. may alternatively provide an extrinsic strain.

In addition, the above-described embodiment of the present invention has been applied to a case of depositing a p-type epitaxial layer on a p-type semiconductor substrate. The present invention is also applicable to the cases of depositing an n-type epitaxial layer on an n-type semiconductor substrate, an n-type epitaxial layer on a p-type semiconductor substrate, and a p-type epitaxial layer on an n-type semiconductor substrate.

The present invention has been particularly described with reference to the embodiments. However, the present invention is not rigidly restricted to the above embodiments. A person skilled in the art will understand that he can make various changes and modifications without departing from the scope of the present invention.

What is claimed is:

1. A method of controlling density and creation of misfit dislocations in a process of producing an epitaxial semiconductor wafer comprising an impurity-doped semiconductor substrate and an impurity-doped epitaxial layer deposited on the semiconductor substrate, comprising the steps of:

creating a mechanical strain on the back surface of the semiconductor substrate; and depositing the epitaxial layer on the mechanically strained semiconductor substrate, the epitaxial layer having an impurity concentration smaller than an impurity concentration of the semiconductor substrate by a factor of at least $10^3$, so as to increase the frequency of creation of misfit dislocation and control the density of creation of misfit dislocation in and near the interface between the semiconductor substrate and epitaxial layer.

2. A method of controlling the density and creation of misfit dislocations as recited in claim 1, wherein the mechanical strain creating step includes a sandblast.

3. A method of controlling the density and creation of misfit dislocations as recited in claim 1, wherein the semiconductor substrate is p-type.

4. A method of controlling the density and creation of misfit dislocations as recited in claim 3, wherein the epitaxial layer is p-type.

5. A method of controlling the density and creation of misfit dislocations as recited in claim 3, wherein the epitaxial layer is n-type.

6. A method of controlling the density and creation of misfit dislocations as recited in claim 1, wherein the semiconductor substrate is n-type.

7. A method of controlling the density and creation of misfit dislocations as recited in claim 6, wherein the epitaxial layer is p-type.

8. A method of controlling the density and creation of misfit dislocations as recited in claim 6, wherein the epitaxial layer is n-type.

9. A method of controlling the density and creation of misfit dislocations as recited in claim 1, wherein the impurity concentration of the semiconductor substrate is $1 \times 10^{18}$ atoms/cc or more and the impurity concentration of the epitaxial layer is $1 \times 10^{15}$ atoms/cc or less.

* * * * *